(12) United States Patent
Tsironis

(10) Patent No.: US 12,699,157 B1
(45) Date of Patent: Aug. 4, 2026

(54) SYNTHETIC LOAD PULL TUNING PROBE AND METHODS

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 160 days.

(21) Appl. No.: 18/750,429

(22) Filed: Jun. 21, 2024

(51) Int. Cl.
| | |
|---|---|
| *G01R 27/04* | (2006.01) |
| *G01R 27/06* | (2006.01) |
| *G01R 27/32* | (2006.01) |
| *G01R 35/00* | (2006.01) |

(52) U.S. Cl.
CPC ........... *G01R 35/005* (2013.01); *G01R 27/06* (2013.01); *G01R 27/32* (2013.01)

(58) Field of Classification Search
CPC ...... G01R 35/005; G01R 27/04; G01R 27/06; G01R 27/32; G01R 31/2822
See application file for complete search history.

(56) References Cited

U.S. PATENT DOCUMENTS

| | | | | |
|---|---|---|---|---|
| 6,850,076 | B2 | 2/2005 | Tsironis | |
| 6,980,064 | B1 | 12/2005 | Boulerne | |
| 7,042,233 | B1 * | 5/2006 | Boulerne | ............... G01R 27/28 |
| | | | | 333/263 |
| 8,098,112 | B2 | 1/2012 | Simpson | |
| 8,358,186 | B1 | 1/2013 | Tsironis | |
| 8,362,787 | B1 * | 1/2013 | Tsironis | ................. G01R 27/32 |
| | | | | 324/638 |
| 8,427,255 | B1 * | 4/2013 | Tsironis | .................... H01P 5/04 |
| | | | | 333/263 |
| 9,252,738 | B1 | 2/2016 | Tsironis | |
| 9,625,556 | B1 | 4/2017 | Tsironis | |
| 11,038,249 | B1 * | 6/2021 | Tsironis | .................... H01P 5/04 |
| 11,621,468 | B1 * | 4/2023 | Tsironis | .................. H03H 7/38 |
| | | | | 333/33 |
| 2013/0321092 | A1 * | 12/2013 | Simpson | ................ G01R 33/00 |
| | | | | 333/17.3 |

OTHER PUBLICATIONS

"Load Pull" [online] Wikipedia, [Retrieved on Aug. 24, 2017]. Retrieved from Internet <URL: https://en.wikipedia.org/wiki/Load_pull>.
"Computer Controlled Microwave Tuner—CCMT", Product Note 41, Focus Microwaves Inc., Jan. 1998.

* cited by examiner

*Primary Examiner* — Thang X Le

(57) ABSTRACT

Multi-band remotely configurable synthetic tuning probes for slide screw impedance tuners allow combined larger frequency coverage beyond the capacity of existing tuning probes using the single horizontal and vertical axis mechanism of a prior art single probe, single band tuners. This is done by combining three tuning slugs, a center controlling slug and two dependent side slugs into a configurable synthetic tuning probe mounted in the single mobile tuner carriage and controlled using the same single vertical axis mechanism. The side slugs are spring-loaded towards and slide vertically independently on each other on both sides of the center slug and are lockable at distinct relative vertical positions. Their vertical position is controlled by the prongs of a fork permanently attached to the tuner slabline which hook on to the slide slugs separately.

5 Claims, 17 Drawing Sheets

STATE 1

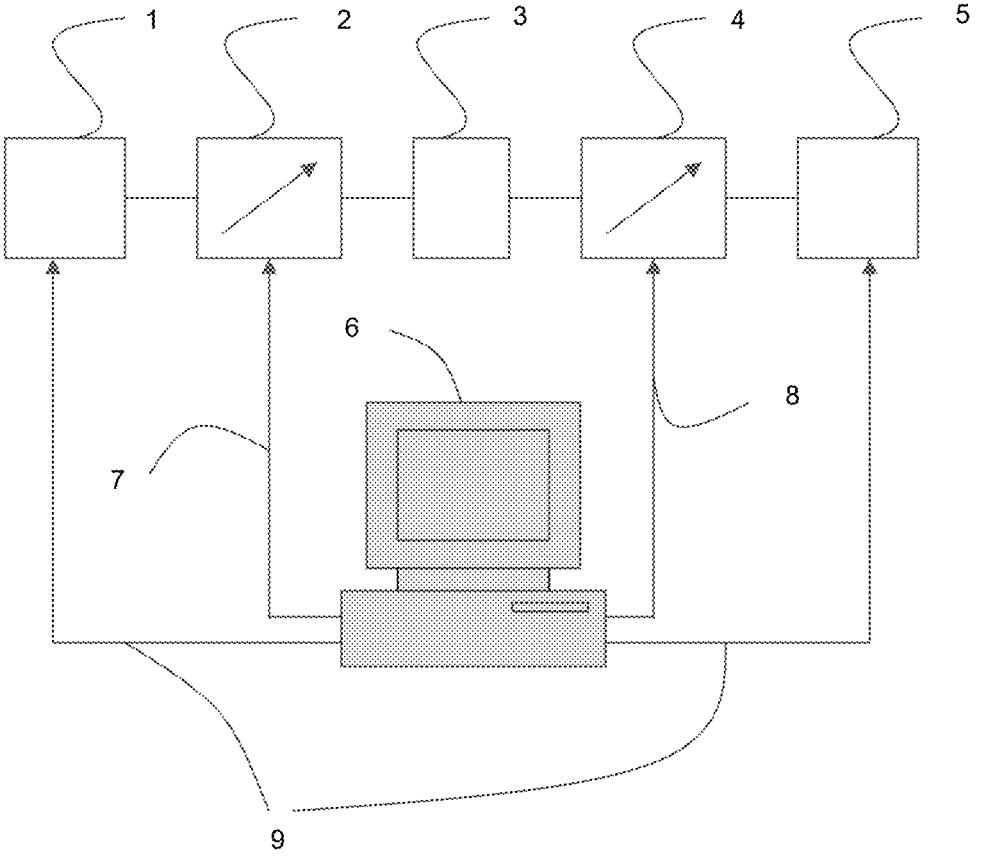
FIG. 1: Prior art

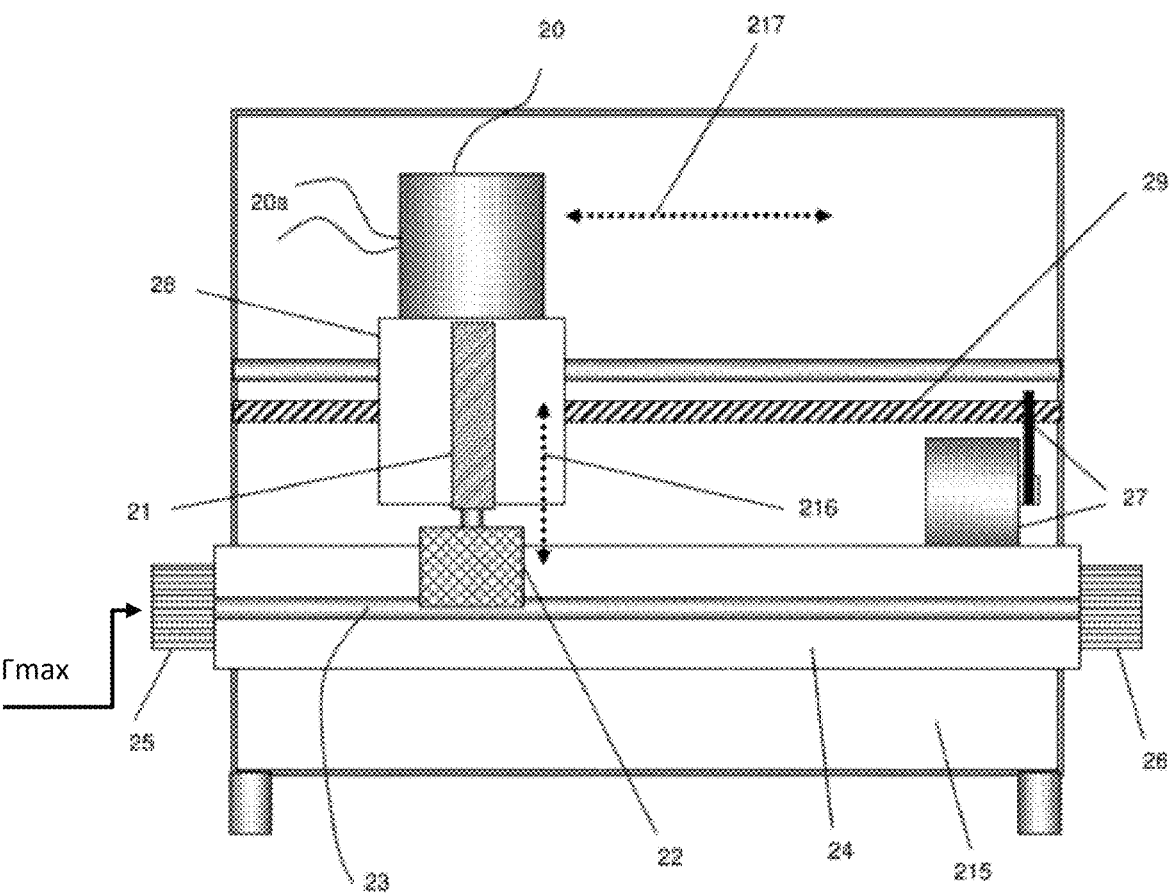
FIG. 2: Prior art

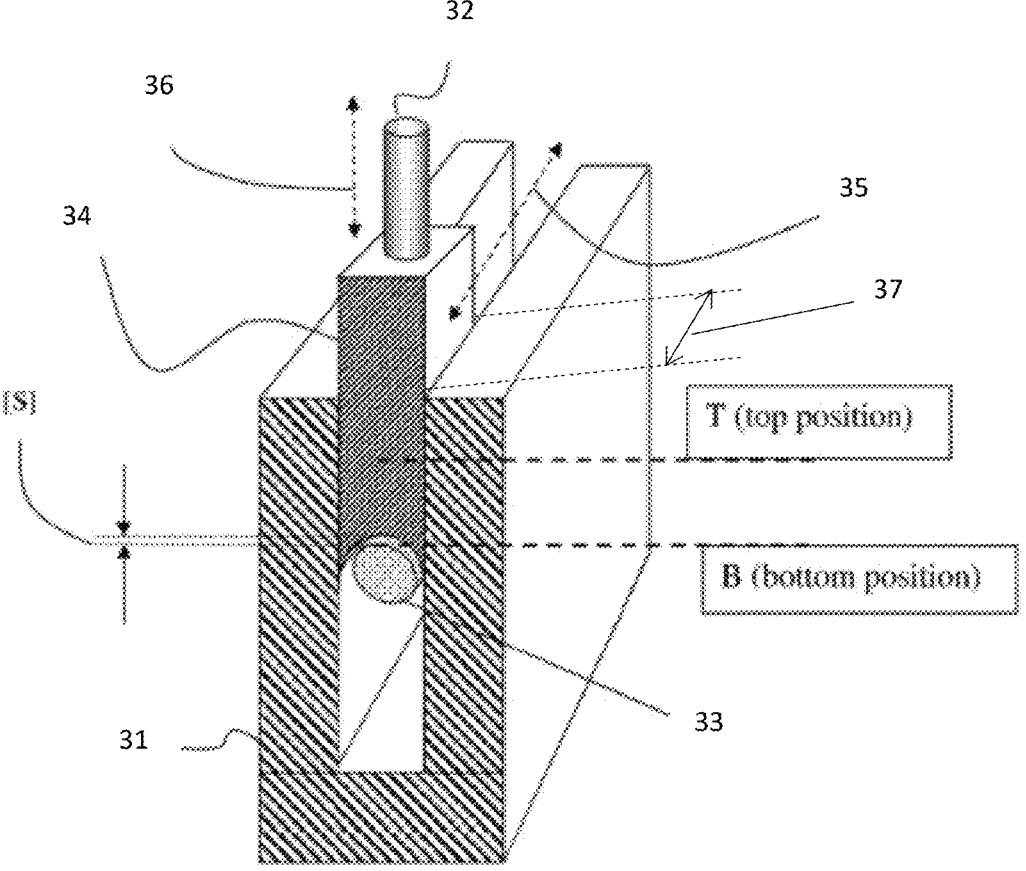
FIG. 3: Prior art

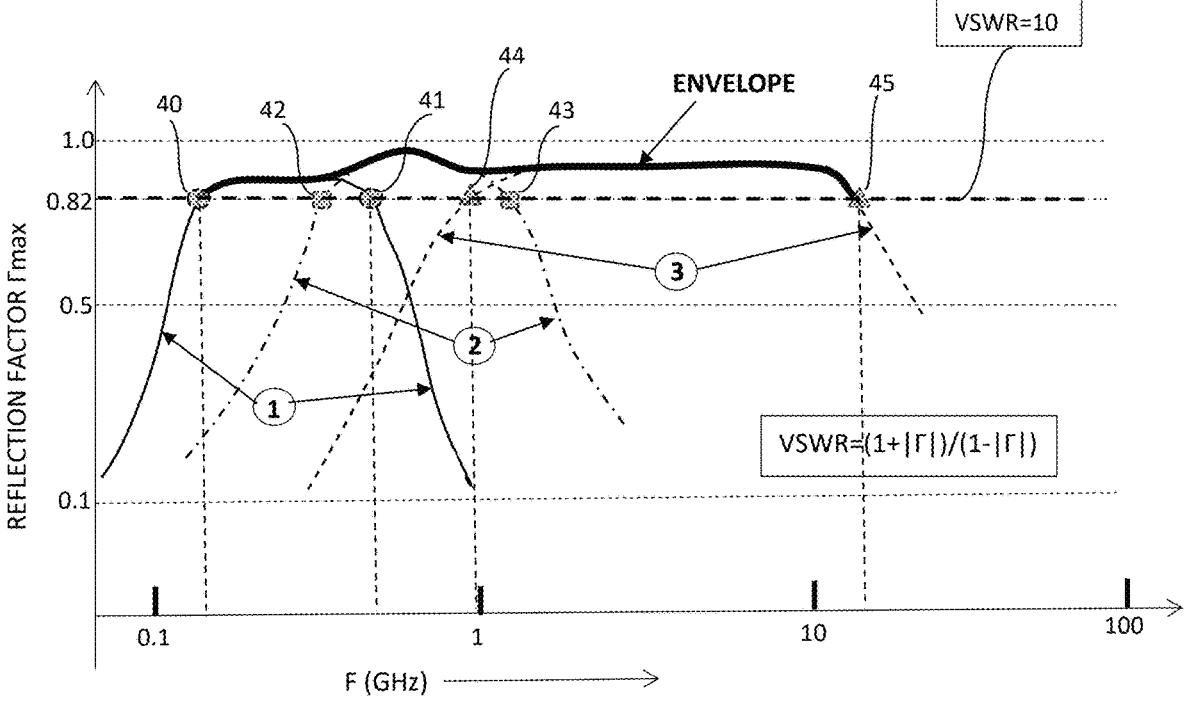
FIG. 4: Prior art

HANDLE TO VERT AXIS

CENTER SLUG

STEEL BALL

PROTRUDING STUDS ON SIDE SLUGS

50

51

HIGH COUPLING &REFLECTION

LOW COUPLING &REFLECTION

CENTER CONDUCTOR

SLABLINE

CENTER CONDUCTOR

STATE 123

SYNTHETIC LOAD PULL TUNING PROBE AND METHODS

PRIORITY CLAIM

Not Applicable

CROSS-REFERENCE TO RELATED ARTICLES

1. "Load Pull" [online] Wikipedia, [Retrieved on 2017 Aug. 24]. Retrieved from Internet <URL: https://en.wikipedia.org/wiki/Load_pull>.
2. "Computer Controlled Microwave Tuner, CCMT", Product Note 41, Focus Microwaves Inc. 1998, pages 2-4.
3. Tsironis, C. U.S. Pat. No. 8,358,186, "Impedance Tuners with Resonant Probes".
4. Boulerne, P. U.S. Pat. No. 6,980,064, "Slide-screw Tuner with Single Corrugated Slug".
5. Simpson, G. U.S. Pat. No. 8,098,112, "Impedance Tuner Systems and Probes".
6. Tsironis, C. U.S. Pat. No. 9,252,738, "Wideband Tuning Probes for Impedance Tuners and Method".
7. Tsironis, C. U.S. Pat. No. 9,625,556, "Method for Calibration and Tuning with Impedance Tuners".
8. Tsironis, C. U.S. Pat. No. 6,850,076, "Microwave tuners or wideband high reflection applications".

BACKGROUND OF THE INVENTION

This invention relates to testing of microwave transistors (DUT) in the high frequency (typically GHz range) domain using Load Pull (see ref. 1). Load Pull is a measurement method whereby the load impedance presented to the DUT at a given frequency is changed systematically and the DUT performance is registered, with the objective to find an optimum embedding (matching) network for obtaining the design objectives, which may be maximum gain, power, efficiency, linearity or else.

PRIOR ART

A popular method for testing and characterizing medium to high-power microwave transistors (DUT, device under test) is called "load-pull" and uses appropriate test setups (FIG. 1 and ref. 1). Low noise transistors are tested using "source-pull". Load or source pull use impedance tuners 2, 4 (see ref. 2) and other test equipment, such as signal or noise sources 1, test fixtures housing the DUT 3, and power meters or low noise receivers 5, the whole controlled by a computer 6; the computer controls and communicates with the tuners 2, 4 and the other equipment 1, 5 using digital cables 7, 8, 9. The tuners are used in order to manipulate the microwave impedance conditions in a systematic and controlled manner, under which the DUT is tested (see ref. 1); impedance tuners allow determining the optimum impedance conditions and embedding (matching) networks for designing amplifiers and other microwave components for specific performance targets, such as low noise parameters, gain, efficiency, intermodulation etc. Since the tuning probe 34 is capacitively coupled with the center conductor 33, increasing the reflection factor means increasing the maximum controllable capacitance between the probes and the center conductor, which is possible by reducing the gap between the probe and the center conductor while avoiding a short circuit, only by increasing the horizontal length 37 of the probe (slug). Various types of resonant or combination tuning probes, including one or more slugs, have been reported before (see ref. 3, 4, 5 and 6); however, none includes synthetic tuning probes configurable using movement control by a single vertical axis mechanism; in ref. 4 to 6 the objective has been to increase the tuning dynamic (GAMMA MAX or Γmax) in certain frequency areas using statically configured multi slug tuning probes, and in ref. 3 the embodiment permits narrowband static frequency selective tuning operation of single slug tuning probes.

BRIEF DESCRIPTION OF THE INVENTION

The objective of this invention is a multi-state, multi frequency-band remotely configurable (synthetic) tuning probe (slug) system for slide screw impedance tuners controlled by a single vertical axis mechanism, that allows larger continuous frequency envelope coverage, beyond the capacity of each individual tuning slug or static combination of slugs, relying only on the single horizontal and vertical axis control mechanism of existing single slug, single frequency band tuners (see ref. 2). This is done here by combining three tuning slugs, vertically sliding seamlessly against each other, lockable vertically and moving together horizontally as a single unit. When the three slugs (named in direction from the control port as slug 1, slug 2 and slug 3, wherein slugs 1 and 2 are side slugs and slug 2 is a center slug, see FIG. 12A) are identical then there are four possible configurations: 1, 12, 123 and 13, in which case configuration 1 covers the highest frequency band, configuration 12 covers a medium frequency band and configuration 123 covers the lowest frequency band, and configuration 13 is a notch (fixed pre-match) probe having very high reflection in a limited frequency range (FIGS. 4 and 10). The slugs are spring pre-loaded against the center slug as shown in FIG. 16, and lockable at distinct vertical positions against it as shown in FIG. 11). The vertical relative movement of the slugs is obtained using a special permanent fork as shown in FIG. 15. The procedure for switching configurations is shown in the flowchart of FIG. 7.

DETAILED DESCRIPTION OF THE DRAWINGS

The invention and its mode of operation will be better understood from the following detailed description when read with the appended drawings in which:

FIG. 1 depicts prior art, a typical scalar (measuring amplitude only) load pull test system using pre-calibrated passive tuners.

FIG. 2 depicts prior art, a schematic front view of a passive slide screw load pull tuner.

FIG. 3 depicts prior art, a perspective view of a metallic reflective tuning probe (slug).

FIG. 4 depicts, schematically, typical maximum reflection factor of individual (non-identical) slugs as a function of frequency and the frequency band overlapping.

FIG. 5A depicts close coupling high Gamma; FIG. 5B depicts loose coupling minimum Gamma (reflection).

Figure 10:
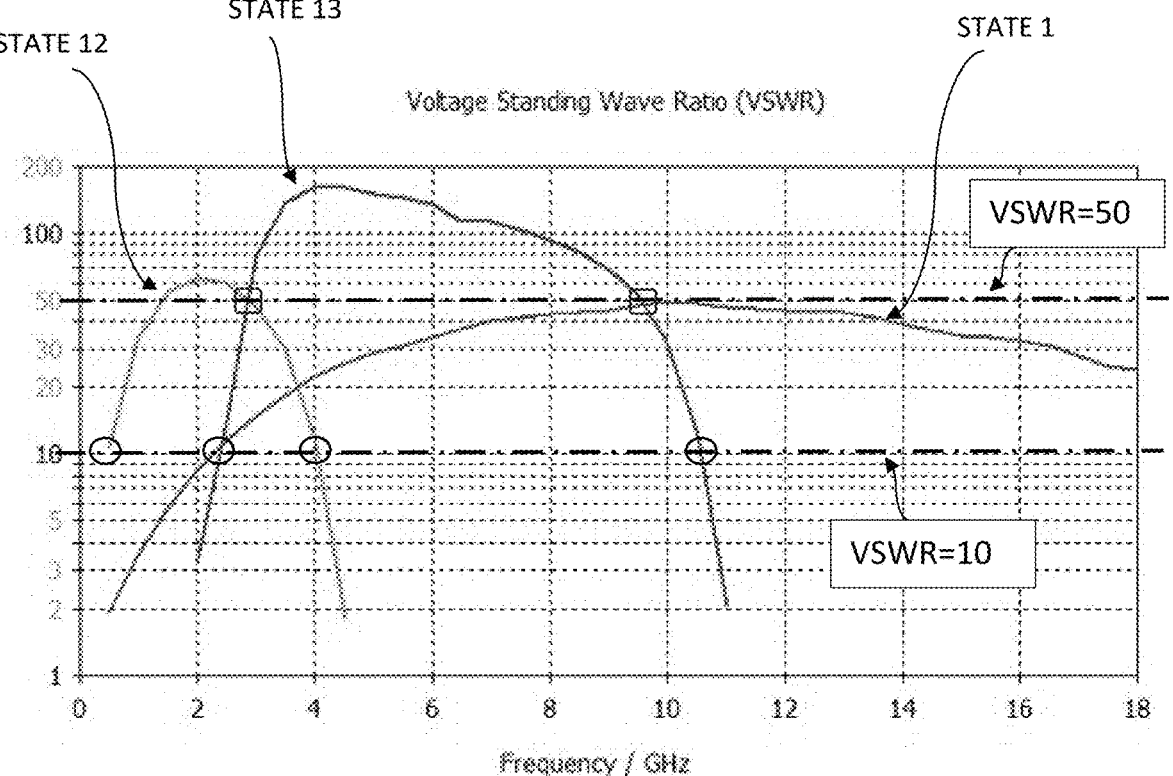

FIG. 10 depicts the typical frequency response of the maximum VSWR (reflection) of various states of a synthetic probe: state 1 is when the first side slug is inserted, state 23 when the center and the third (second side slug) are both inserted and state 13 when the first and second side slugs are inserted creating the narrower band high reflection notch slug.

Figure 11:
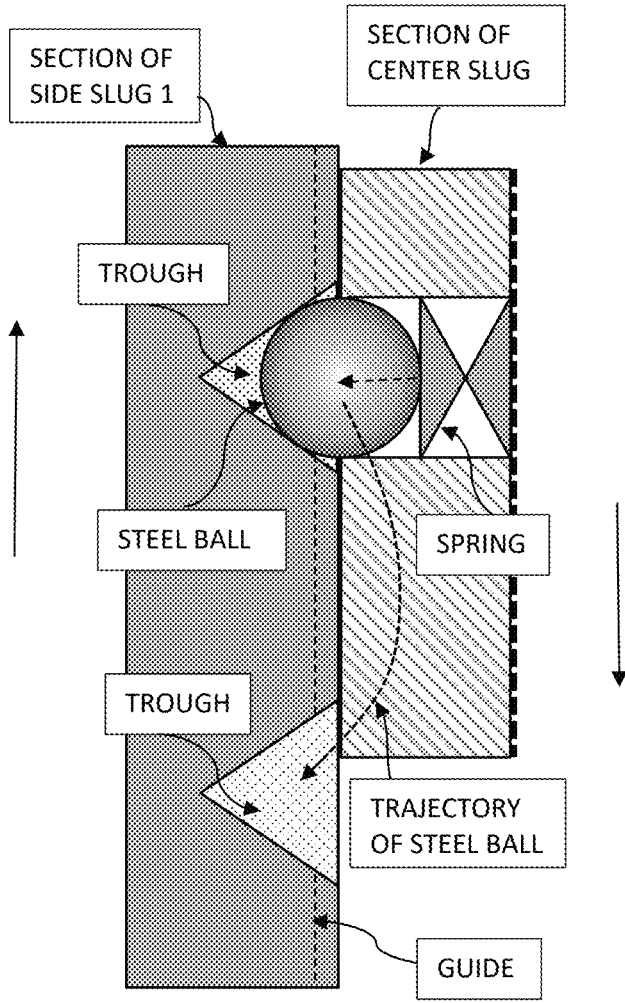

FIG. 11 depicts the detailed mechanism of interlocking between slugs using spring-loaded steel balls on the center slug and built-in troughs into the side slugs.

Figure 12A:
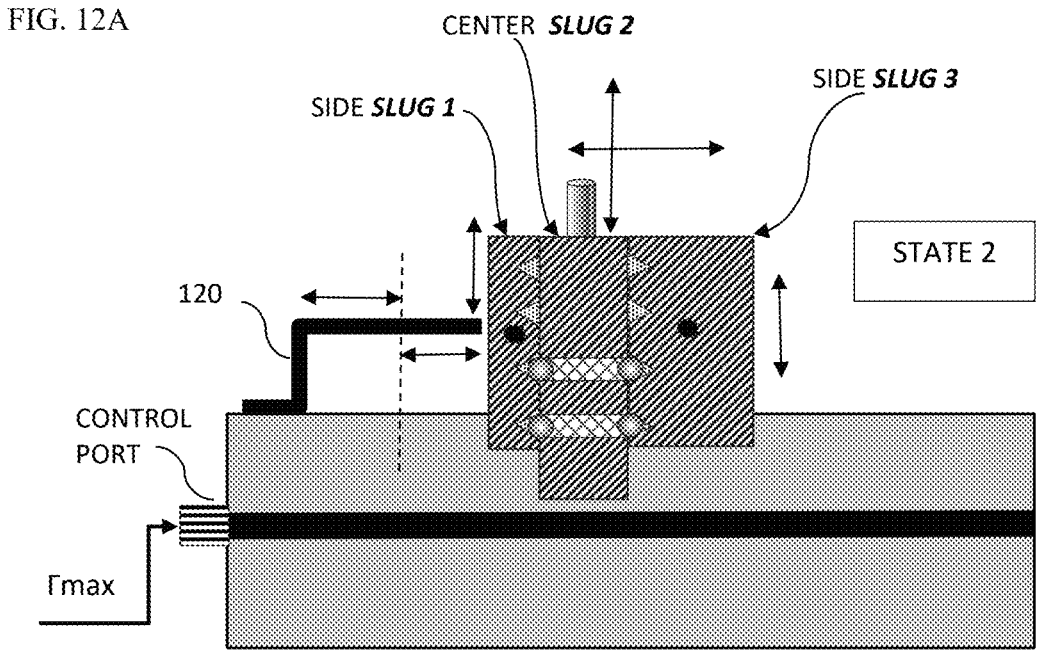
Figure 12B:
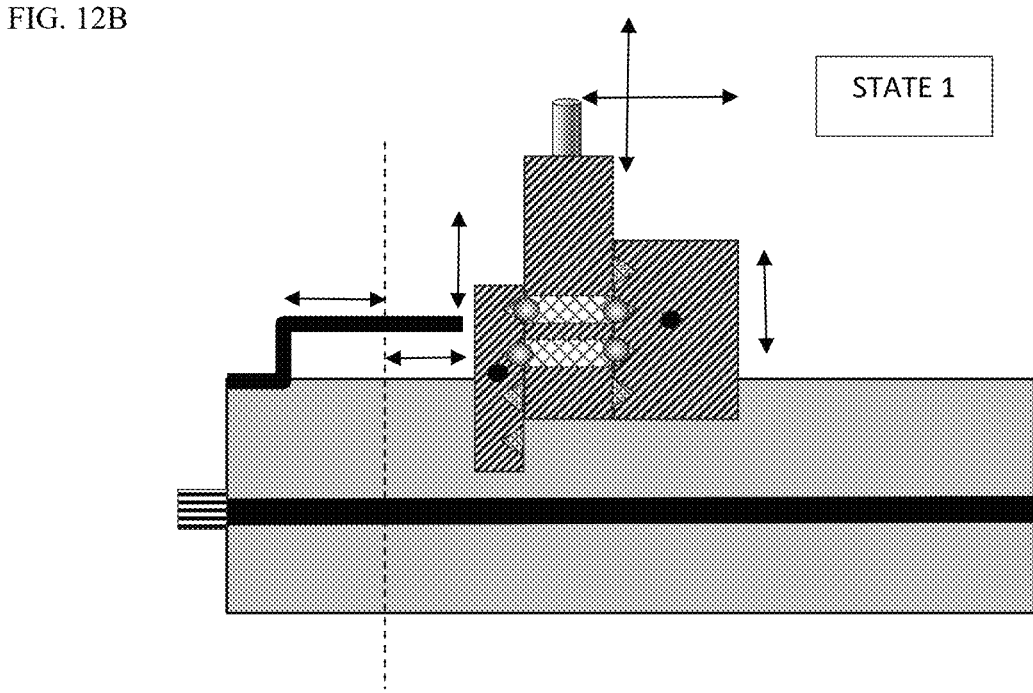

FIG. 12A through 12B depict configurations of the synthetic tuning probe: FIG. 12A depicts state 2 (center slug inserted); FIG. 12B depicts state 1 (first side slug inserted, highest frequency band).

Figures 13A, 13B:
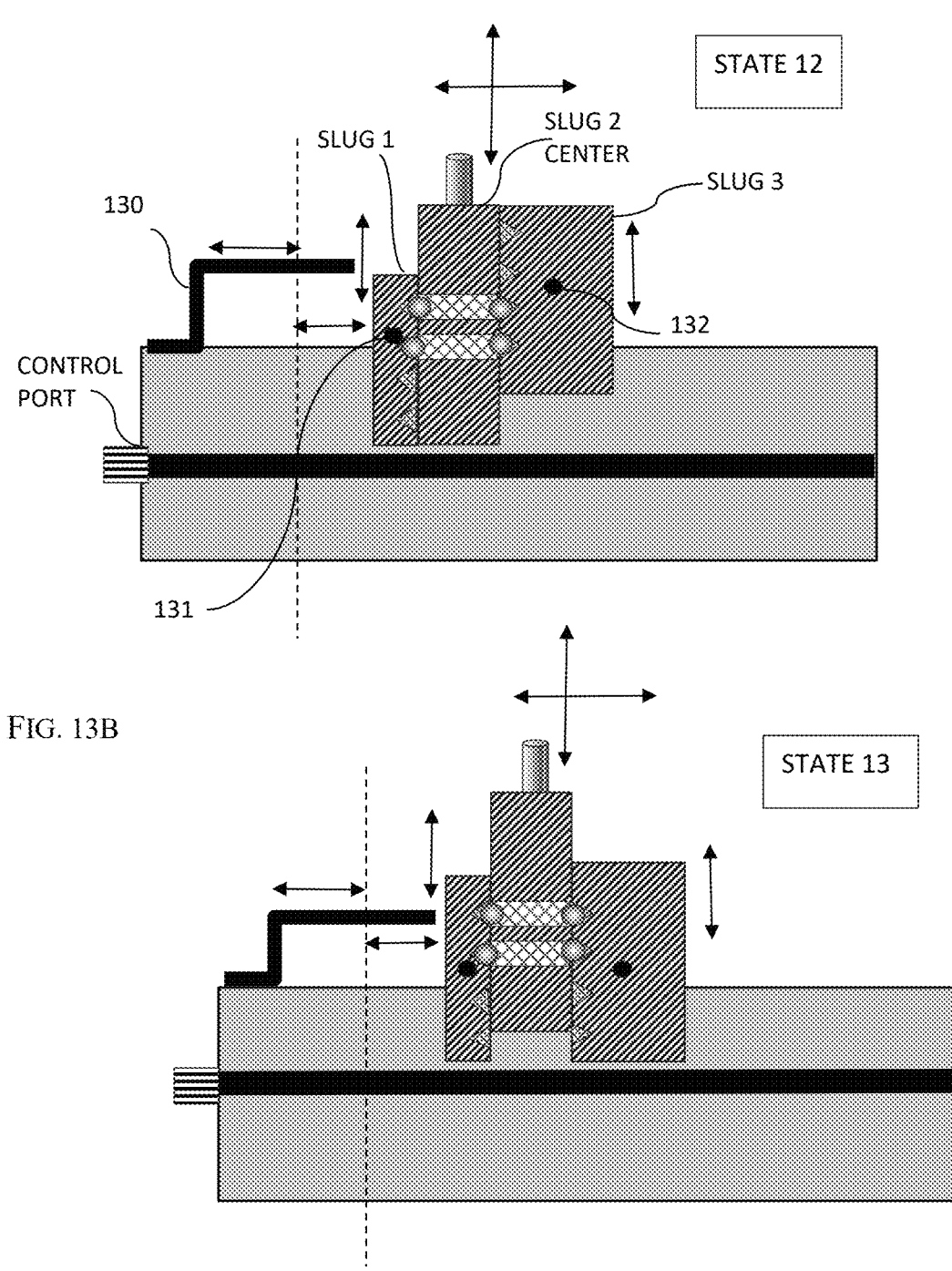

FIG. 13A through 13B depict configurations of the synthetic tuning probe: FIG. 13A depicts state 12 (first slug and center slug inserted); FIG. 13B depicts state 13 (high Imax notch slug).

Figure 14:
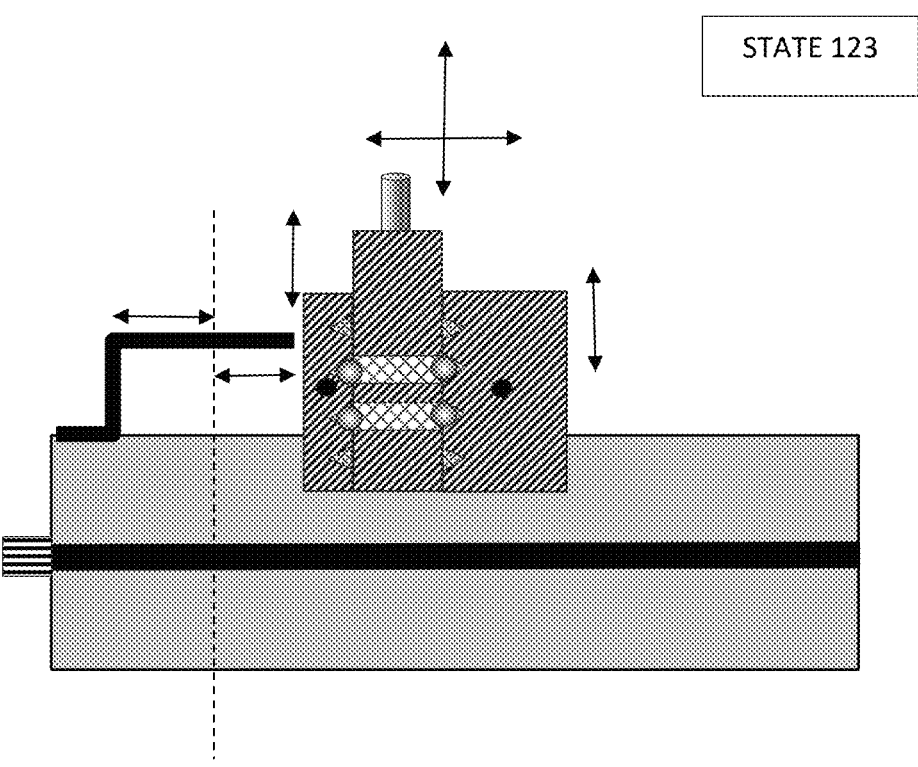

FIG. 14 depicts state 123 (all slugs inserted, lowest frequency band).

Figure 15:
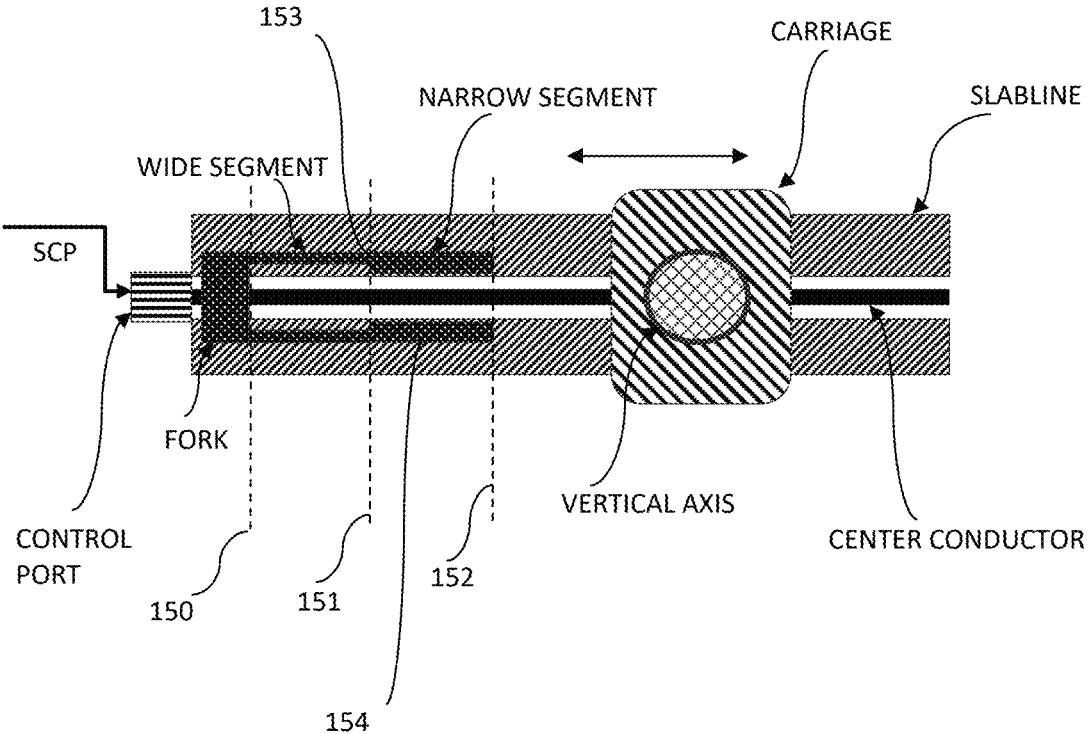

FIG. 15 depicts the top view of the carriage and the permanent two-segment control fork.

Figure 16:
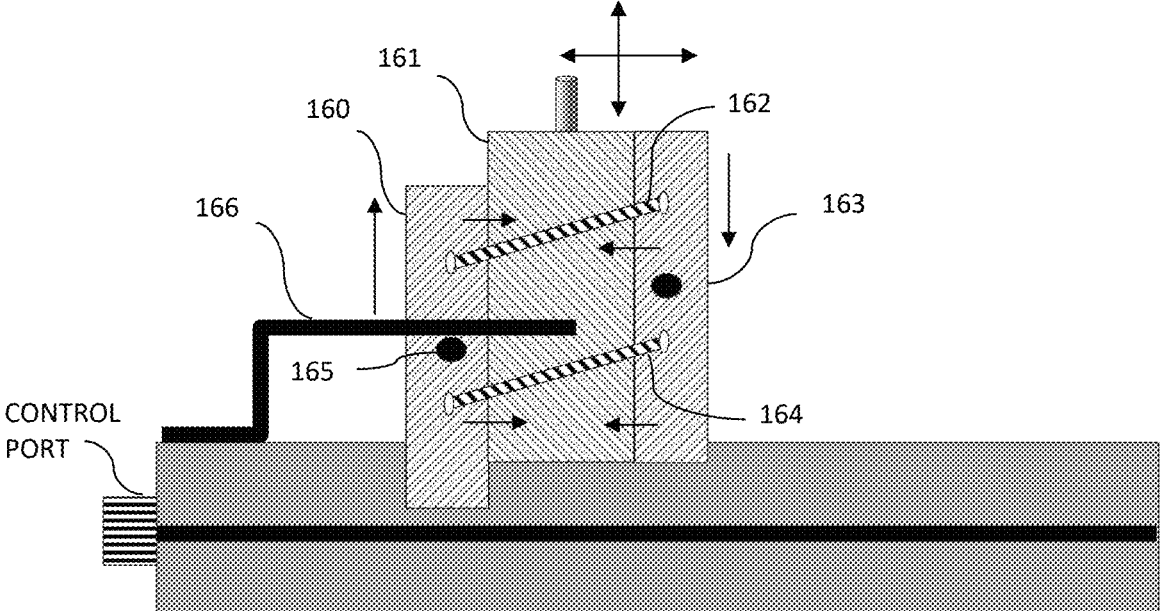

FIG. 16 depicts the front view of the spring pre-loading of the side slugs against the confined center slug.

Figure 17:
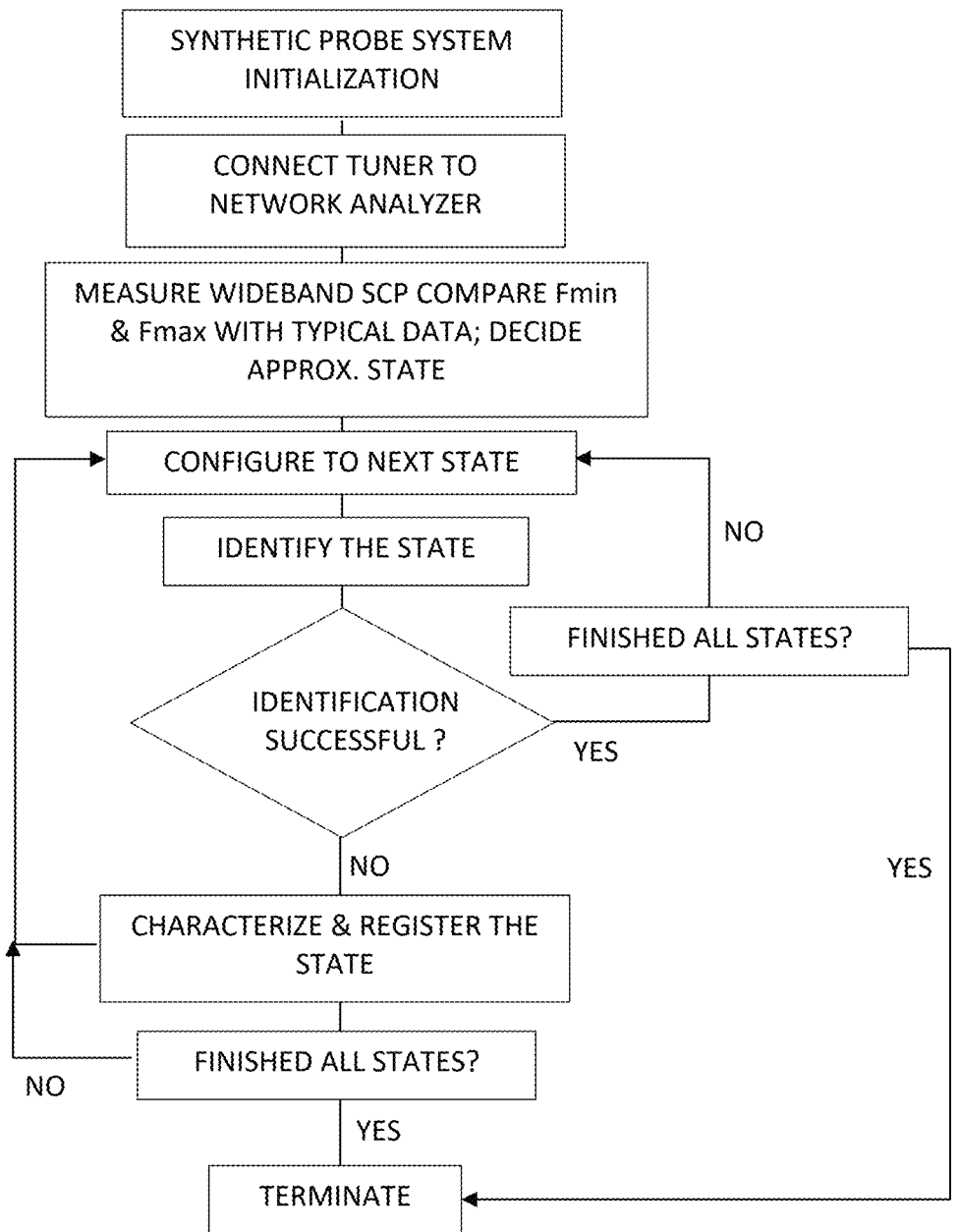

FIG. 17 depicts a flowchart of the overall initialization procedure of synthetic tuning probes for slide screw tuners.

DETAILED DESCRIPTION OF THE INVENTION

There are two main components in the project of synthetic tuning probes: one is the structure itself and the other is the remote automated handling; the figures describing the structure are 5, 6, 11-16; the figures describing the method and the specific hardware are 7-9 and 17; FIGS. 4 and 10 show typical results. The critical issues are, first how to control and modify and, second how to recognize the configuration of the synthetic probe without manual or visual intervention with the tuner. A typical prior art slide screw tuner is shown in FIG. 2: it includes a slabline 24 with a center conductor 23, a test port 25 and an idle port 26. Inside the tuner housing 215 there is a mobile carriage 28 traveling 217 along the slabline, driven by a screw 29 and a stepper motor and gear 27 in form of a timing belt, a rack and pinion drive or else; in the carriage 28, there is a highly precise, zero-backlash vertical axis mechanism 21 moving the tuning probe 22 towards and away 216 from the slabline holding securely the capacitively coupled with the center conductor 23 tuning probe (slug) 22. The vertical axis mechanism 21 and the slug 22 are controlled by a second vertical stepper motor 20 which is also remotely controlled 20a. It is this type of traditional, proven, tuner technology this invention uses for the configurable synthetic tuning probe system.

The typical prior art tuning probe (slug) is shown in FIG. 3: it includes a body 34 and has a concave bottom surface matching the diameter of the cylindrical center conductor 33 of the slabline 31, and a holding pin 32 to be attached to the vertical axis mechanism 21. The slug moves vertically 36 and horizontally 35 controlled by the vertical axis 21 and the horizontally moving carriage 28. Vertically, the tuning probe moves between a top position T and a bottom position B leaving a small gap [S] for maximum capacitive coupling and to avoid a short circuit. The length 37 of the parallel-epiped slug is defined along the slabline, the thickness of the slug is defined perpendicular to the axis of the slabline, designed to slide-fit between the slabline walls. Throughout this disclosure we use the terms horizontal and vertical to describe the movement of the tuning probes relative to the slabline; horizontal means along or parallel to the slabline, vertical means perpendicular to the slabline; if the tuner is mounted under an angle, horizontal is in reality not parallel to the slabline, but in this context this means parallel to the slabline, and vertical means perpendicular to the slabline. The tuners can be used flat on the bench or inclined on a wafer probe station to match the angle of the wafer probe and optimize the interconnection between tuner and wafer probe. For this reason, the traditional terms "horizontal" and "vertical" do not always apply readily; however, for the scope of this disclosure and for simplification, horizontal means along or parallel to the tuner slabline and its center conductor, and vertical means perpendicular to the axis of the slabline and center conductor. In any case the predominant item is the center conductor.

Figures 5A, 5B:
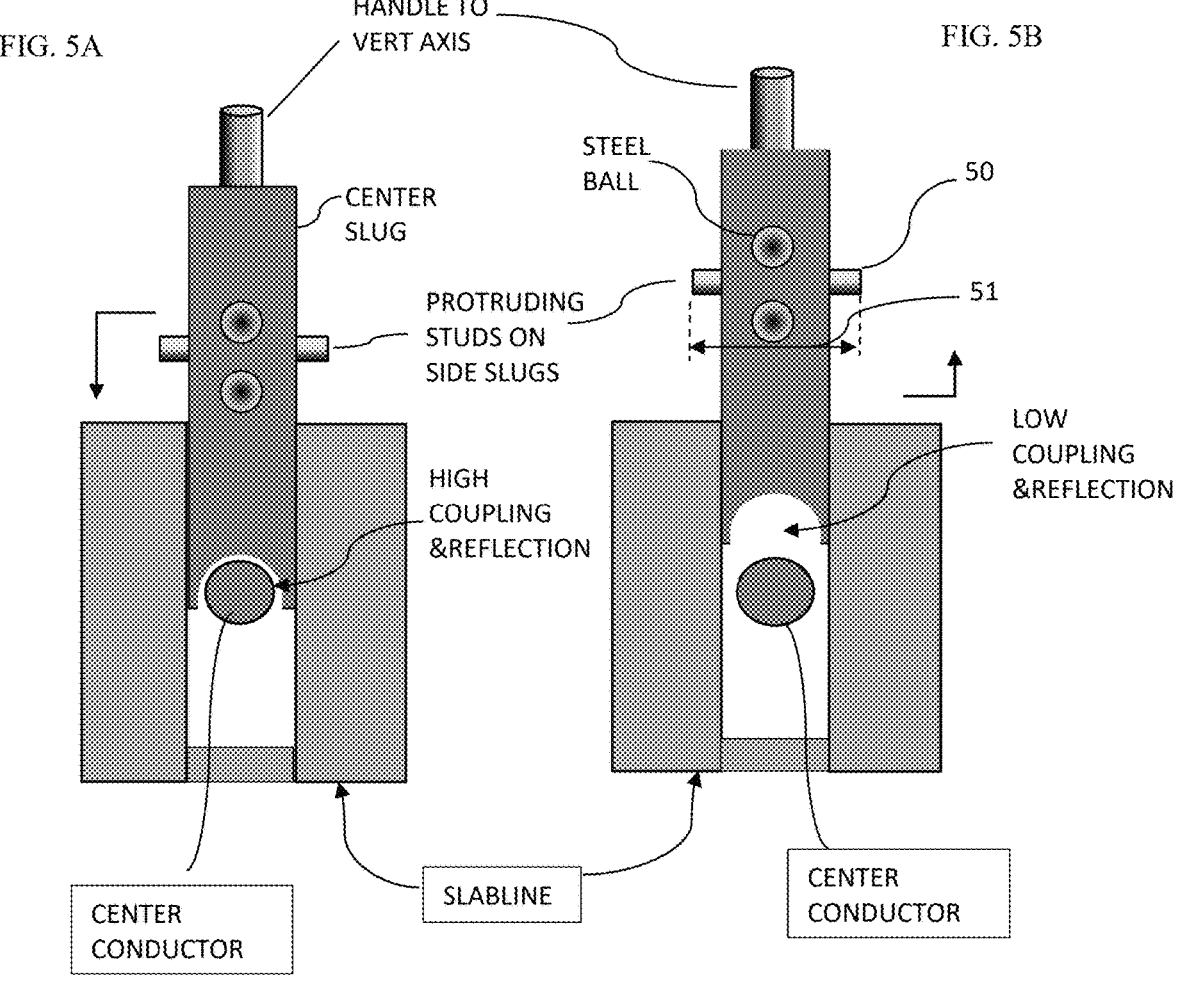
FIG. 5A through 5B depict cross section of synthetic probe in vertical positions.
Figure 6:
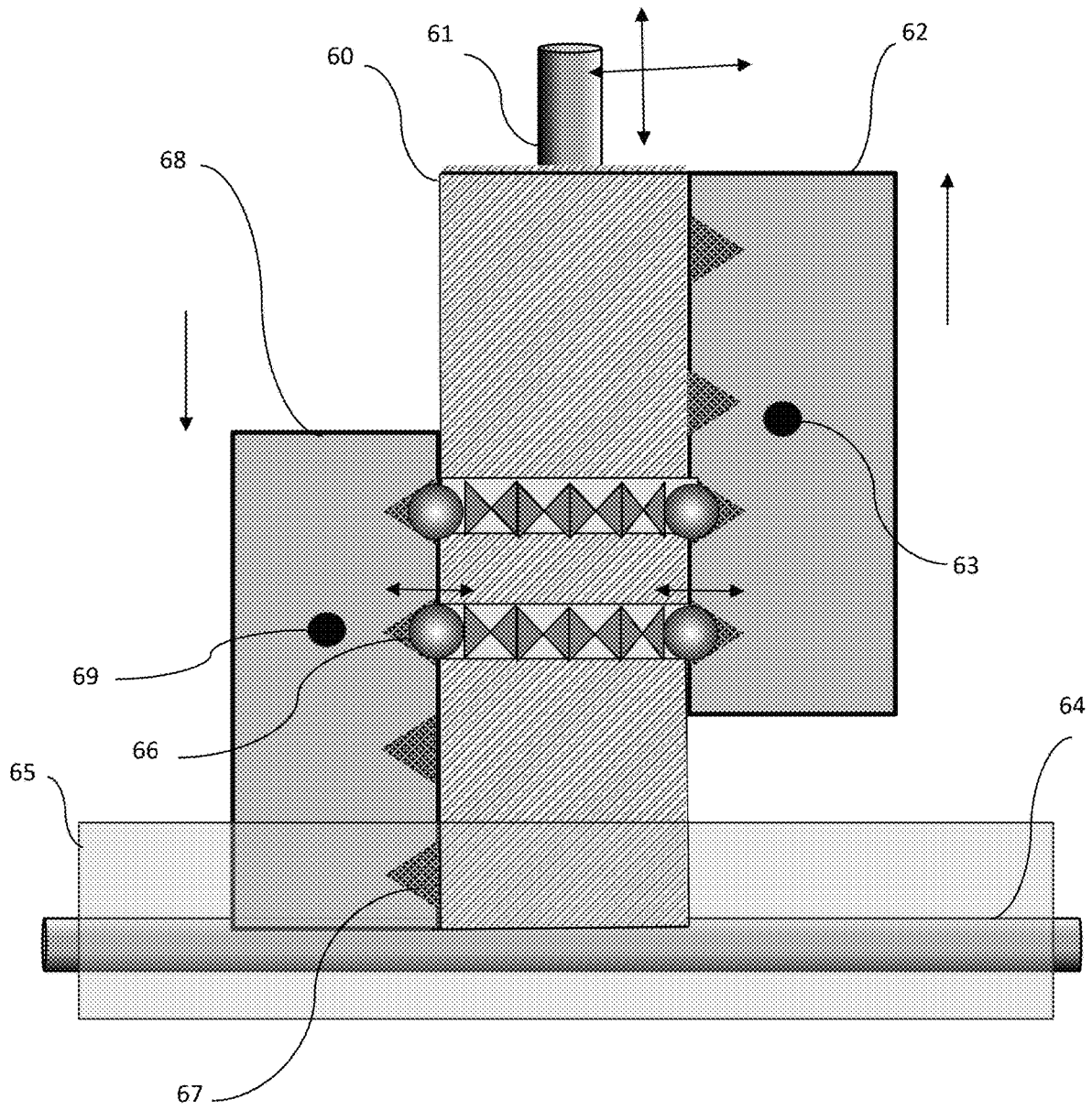
FIG. 6 depicts in a cross section parallel to the axis of the slabline the vertical positioning and locking of the side slugs against the center slug in the configuration 12.

The new tuning probe system is shown in FIG. 6: the concept is the same, whether the slugs are identical or different; it includes a center slug 60 attached using the pin 61 to the vertical axis mechanism 21 like the prior art slug 34 of FIG. 3; it also includes two side slugs 68 and 62 movable vertically in and out of the slabline 65 against the center slug 60 and lockable vertically using the spring ball and trough mechanism of FIG. 11. The movement and proximity to the center conductor 64 is controlled by engaging the side slug 62 through the stud 63 and moving the center slug 60 vertically: to move slug 62 upwards relative to the slug 60 we grab the stud 63 from underneath using the fork 120 (FIG. 12A) and lower slug 60. However, to avoid fork 120 to engage also stud 69 protruding from both the front and back surfaces of slug 68, the fork has to have the special form shown in FIG. 15, that is, its prongs 153, 154 do not have the same opening along their whole length: instead, the opening is wider close to the control port (or the body of the fork, between the limits 150 and 151) and narrower at the extremity, as indicated by the limits 151 and 152; the width of the two segments is dictated by the shape and thickness of the side slugs. Assuming all three slugs have the same thickness, which they do since they must slide-fit into the slot of the slabline, it is the size of the studs 50 and their protrusion 51 beyond the body of the slugs that decide: the narrow segment 151-152 must let the body of the slugs slip through but catch on the studs, whereas the wide segment 150-151 must let the slugs with the studs with a length 51 pass through; this way, when we put the third slug (second side slug, 62) between the prongs of the narrow segment, we can dictate its vertical position, regardless of the vertical position of the first side slug, which will move with the center slug, but shall not modify its state relative to the center slug. If we move the carriage further away from the control port, then it is the first side slug which will be caught between the prongs of the narrow segment, and we can control its vertical position without affecting the third slug which will now be beyond the reach of the prongs.

Figure 7:
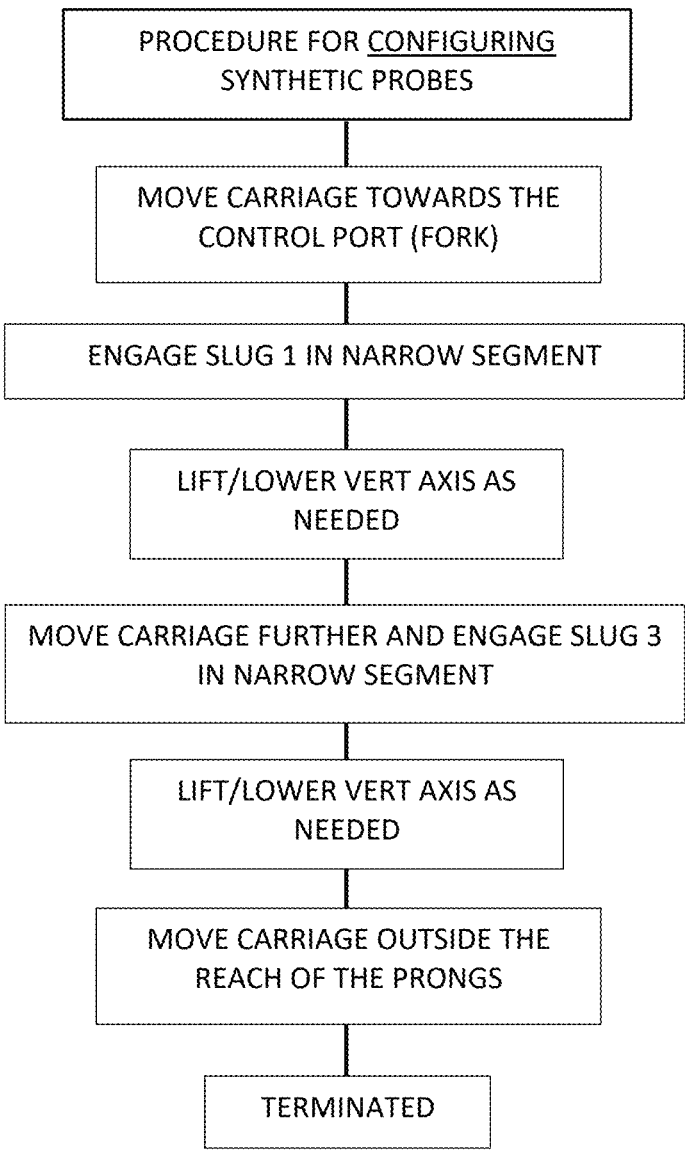
FIG. 7 depicts the flowchart of the configuration procedure of the synthetic tuning probe.
Figure 8:
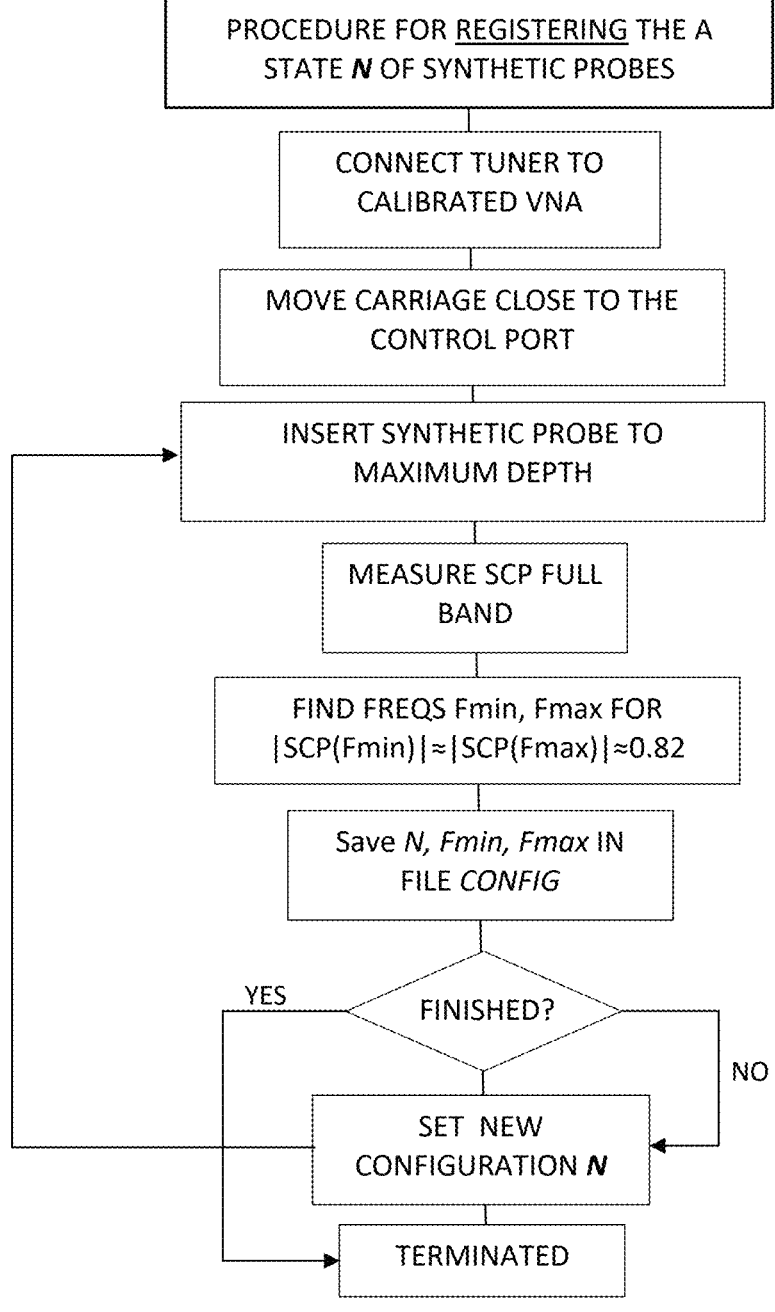
FIG. 8 depicts the flowchart of the registering procedure of a state of the synthetic tuning probe.
Figure 9:
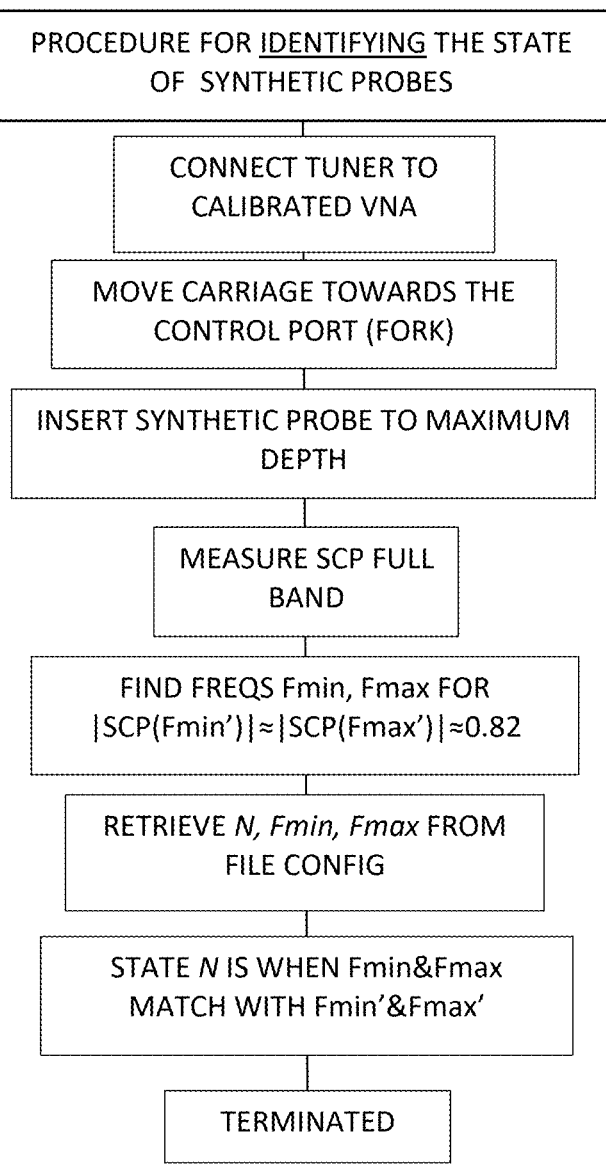
FIG. 9 depicts the flowchart of the identification procedure of the actual state of the synthetic tuning probe.

Arranging (configuring) the relative vertical position of the three slugs follows a specific procedure, as shown in the flowcharts of FIGS. 7, 8 and 9: the three automated routines are not independent: in fact, the user does not know the actual state of the tuner and cannot interfere; a tuner must be configured, characterized, registered and identified to be able to be reconfigured, because configuration depends on the actual status which is unknown but can be identified because of the frequency response of the various configurations (FIG. 10). So, assuming a random state the first step is to characterize and register it using the protocol of flowchart of FIG. 8; this will create the CONFIG file with an initial state and minimum and maximum frequencies (FIG.

4); based on the initial state the synthetic probe is re-configured using the protocol of flowchart of FIG. 7, using the information of FIGS. 12A, 12B, 13A, 13B and 14, since, each time the side slugs must be moved up or down relative to the center slug by engaging the prongs of the fork above or below the studs of each of the side slugs and move the center slug up or down. This cycle must be executed until full registering of all synthetic probe states. This overall initialization procedure is shown in the flowchart of FIG. 17.

It goes as follows (FIG. 17): first of all we must assume that the actual status of the synthetic tuning probe is unknown; however, to be able to begin, there must be somewhere a data file with typical retrievable values for Fmin and Fmax for some basic configurations as shown in FIG. 4: the tuner is then connected to a pre-calibrated wideband vector network analyzer (VNA) and the tuning probe is inserted into maximum depth (penetration) creating maximum wideband reflection. Reading the reflection factor $\Gamma$ max over frequency and comparing with the retrieved Fmin and Fmax data for |$\Gamma$max|$\approx$0.82 reveals the actual state of the synthetic probe and, by that, the strategy to employ to switch between states following the schematic pictures in FIGS. 12A, 12B, 13A, 13B and 14; every time a next state is configured, it must be identified, i.e. the file CONFIG must include Fmin and Fmax data corresponding to the measured |$\Gamma$max|; for the initialization to be complete we check if all possible states have been processed and termi-nate if this is the case; if not, we change the configuration and process as before; every time the identification is not successful, i.e., the data measured do not match any Fmin and Fmax combinations in CONFIG, then the specific state has not been registered yet and it must now be registered, and saved; again we check if all possible configurations have been registered and terminate or run the loop again. For instance, to switch between states 12 and 13 (FIGS. 13A and 13B) we first engage the prongs of fork 130 above the stud 131 of slug 1 and lift the axis with the center slug 2 by two steps; this places slug 1 lower than the center slug 2; then we lower the axis to maximum depth; this brings the stud 132 of slug 3 within reach of the prongs; then we move the carriage towards the control port and engage the prongs above the stud 132 of slug 3 and lift the axis with the center slug 2 by two steps; this brings slug 3 at the same level as slug 1 in the configuration 13 of FIG. 13B. Similar strategies are pre-programmed in the tuner's firmware for switching between the remaining states.

The three vertically adjustable tuning slugs allow a num-ber of possible synthetic probe configurations mainly depending on the horizontal size of each slug; if the three slugs are identical, then there are four possible configura-tions: designating the side slug closest to the tuner test port 25, as slug 1 (FIG. 12A), the center slug, as slug 2 and the second side slug as slug 3, then the four possible configu-rations of slugs being approachable to the center conductor 23 can, meaningfully, be called STATE 1, STATE 12, STATE 13 and STATE 123; in this particular case each single slug creates essentially the same reflection as STATE 1, the two slugs 1 and 2 together increase the frequency band to lower frequencies in STATE 12, and all slugs together in STATE 123, extend the coverage to the lowest possible frequencies; the STATE 13 is a notch slug (FIG. 10) where slug 1 acts like fixed-phase pre-matching to slug 3 (see ref. 8), creating the highest reflection factor $\Gamma$ in limited band-width; the shortest slug, whether the slugs are identical or different, is placed closest to the test port of the tuner, to minimize the insertion loss between the DUT and the slug, which increases with frequency. The control port can be the test port (closest to DUT) or the neutral port; to reduce the insertion loss between DUT and test port we prefer using the neutral port as control port, since the mounting of the fork and the mechanics of controlling the configuration of the synthetic probe require some extra slabline space, that would increase the insertion loss.

If the slugs are different, then more combinations are possible, like STATES 1, 2, 3, 12, 13, 23, and 123; not all possible configurations produce discernible and 0unique benefits. This must be decided in each case individually; of specific interest are notch slug combinations STATE 13 with selected lengths of slugs 1 and 3. Because each slug and each slug combination (FIGS. 4 and 10) creates a different maximum reflection factor footprint, this property of the synthetic probes can be used to remotely identify its actual state; if we define the usual value of VSWR=10 or $\Gamma$=0.82 as a distinction threshold, then we can distinguish trace 1 (largest slug) crossing at points 40 and 41 corresponding to Fmin$\approx$170 MHz and Fmax$\approx$650 MHz and in the case of trace 3 (smallest slug) crossing at points 44 and 45 to Fmin$\approx$1 GHz and Fmax$\approx$12 GHz and similarly for the slug crossing at points 42 and 43; there is a common observation here: Fmax is always twice as big as Fmin, i.e. the slugs cover at least one octave frequency band; even in the extreme case of the notch slug, STATE 13 in FIG. 10 this criterion remains valid and is used to identify the configuration states; how-ever, to identify a notch slug situation one needs to verify also the absolute maximum of the reflection factor response SCP. Since only a STATE 13 is a notch slug (i.e., slug 1 and 3 simultaneously inserted and the center slug withdrawn), a path in the identification process is required using the maximum value; this is done using a VSWR value above 50 or Imax at least 0.96.

Depending on the specific frequency and the DUT to be tested, the configuration of the synthetic probe shall be selected: as an example (FIG. 10), if a device must be tested at 1 GHz, we select state 12, if a device with very low internal impedance (high power) must be tested we select state 13 and if a very high frequency device must be tested we select state 1; this reveals the additional benefit of the synthetic probes, to adapt to the testing requirements.

The locking mechanism between the center slug and the side slugs is visualized in a cross section parallel to the axis of the slabline of the tuning probe assembly in FIGS. 6 and 11: we can see the center slug 60 and the side slugs 68 and 62. We can also see the four troughs spaced vertically by a distance that allows the combinations of the slug compo-nents to operate efficiently, i.e., if one slug is closest to the center conductor to create maximum reflection, the with-drawn slug is "invisible", meaning its own reflection is negligible. This distance depends on the overall size of the components and is roughly 1.5 to 2 times the diameter of the center conductor. The locking works when a slug slides vertically pre-loaded against the other using springs 162 and 164 (FIG. 16) and the steel balls 66, pushed by the spring, hop, drop, and lodge in the opposite troughs; between the troughs 67 there is a shallow vertical groove (GUIDE) built into the side slugs that leads the balls vertically between troughs and keeps the slugs aligned (FIG. 11).

A critical feature of the proposed apparatus is the seam-less and gap-free mechanism of sliding of the side slugs against the controlling center slug. This is shown in FIG. 16: the side slugs 160 and 163 are pulled together spring-loaded using a number of expansion springs 162, 164 on both their sides, front and back symmetrically, pulling them together to squeeze as equally as possible from both sides the center slug 161. The two springs 162 and 164 have to be placed in such a manner as not to conflict with the prongs 166 of the fork when they engage above or below the controlling studs 165 on the moving slugs. The pre-loading of the springs is chosen to apply a sufficient pulling force when the side slugs are at the same height and not too strong a force when they are at maximum difference in height (in which case they are expanded to maximum), so that seamless sliding the slugs against each other is not prohibited by friction. This requires of course adequate polishing of the rubbing surfaces of the slugs and a choice of self-lubricating materials, like brass.

The procedure for switching between tuning probe states is shown in the flowchart of FIG. 7: in a first step the carriage 28 is moved towards the tuner port having the fork (control port) permanently installed. Then the vertical position is arranged for the narrow segment of the prongs of the fork to engage above or below, depending upon the objective, the control studs 131 or 132 of the slug 1 or slug 3 to be displaced vertically against the center slug 2 by moving the center slug 2 up or down together with the non-engaged slug. Reliable switching between tuning modes is secured with pre-loaded steel balls inserted across the center slug (FIGS. 6, 11, 12, 13 and 14), guided vertically using a vertical guiding channel (GUIDE in FIG. 11) engraved in the internal sidewalls of the internal walls of the side slugs and popping into preset throughs along these inner walls; there are three secured settings, a top setting (lock), a middle lock (both side slugs equal) and a bottom lock for each side slug possible.

Since the configurable tuning probe system of the present invention is controlled, for every single frequency, in the corresponding tuning mode, using a single horizontal and vertical control, the calibration of the tuner follows prior art (see ref. 7); if the frequencies to be calibrated are covered by different tuning modes, prior definition of the boundaries between frequency bands, as indicated in FIG. 10, will initiate the slug configuration procedure per flow chart of FIG. 7 at frequency of 3 GHz because both states 12 and 13 generate there the same maximum VSWR.

The present invention discloses configurable synthetic tuning probes and system control thereof compatible with single carriage and single vertical axis load pull tuners, allowing operation in several modes (states), whereby allowing widening the instantaneous frequency bandwidth and the tuning range of the tuner, without the need for additional electronic and remotely controlled mechanical gear. The slugs are mounted and controlled such as to create a longer, a shorter and a notch slug in one automatically reconfigurable assembly. Obvious alternatives shall not impede the originality of the idea.

What is claimed is:

1. An automatically configurable synthetic tuning probe system for a load pull tuner, comprises:

the load pull tuner including a slabline with a center conductor linking two ports, a control port, and a neutral port, and at least one remotely controlled mobile carriage moving along the slabline and having a vertical axis mechanism which moves perpendicular to the slabline, wherein the vertical axis mechanism is configured to holds and being remotely controlled for the configuration of the synthetic tuning probe capacitively coupled with the center conductor;

the synthetic tuning probe including three parallelepiped tuning slugs with a front, a back and two side walls, wherein the three parallelepiped tuning slugs are formed by a center tuning slug confined between two side tuning slugs along the slabline, a first side slug towards the control port and a second side slug towards the neutral port, wherein the center tuning slug is positioned at the vertical axis and wherein the two side slugs slide on their side wall vertically against the side walls of the center slug and are lockable at distinct relative vertical positions using an interlock mechanism; and the configuration of the synthetic tuning probe being remotely controlled and including:

studs protruding from the front and the back wall of each side of the two side slugs perpendicular to the slabline, and an unmovable horizontal fork being parallel to the slabline for controlling independently a vertical position of a side slug relative to the other slugs using only movement of the carriage and the vertical axis, and an automated procedure for controlling the vertical position of the two side slugs.

2. The automatically configurable synthetic tuning probe system of claim 1, wherein the unmovable horizontal fork being attached to the slabline close to the control port and having two horizontal prongs with a wide opening segment between the two prongs towards the control port and a narrow opening segment between the prongs towards the neutral port, wherein the narrow opening segment having the same width as the slugs and the wide opening segment having the same width as the slugs and the protrusion of the studs.

3. The automatically configurable synthetic tuning probe system of claim 2, wherein the automated procedure for configuring the synthetic tuning probe comprising the following steps of:

1) moving the carriage close to the control port;
2) controlling the vertical position of the side slugs configured:
   2a) to control the vertical position of the first side slug, the carriage is moved close enough to the control port, for the first side slug to enter within reach of the narrow segment of the two prongs;
   2b) to control the vertical position of the second side slug, the carriage is moved further closer to the control port, for the second side slug to enter within reach of the narrow segment of the prongs;
3) lowering or lifting the first side slug we engage the first side slug as in step 2a) and lower or lift the center slug until locked;
4) lowering or lifting the second side slug we engage the second side slug as in step 2b) and lower or lift the center slug until locked;
5) lowering or lifting the center slug relative to the side slugs, we engage both side slugs subsequently as in steps 2a) and 2b) and lower or lift the center slug until locked.

4. The automatically configurable synthetic tuning probe system of claim 1, wherein the interlock mechanism using sets of troughs centered vertically on the surface of the two side slugs facing the center slug and sets of spring-loaded steel balls protruding from either side wall of the center slug facing the two side slugs and aligned with the troughs, to allow, when lodged into the troughs, locking of the two side slugs against the center slug at distinct vertical positions.

5. The automatically configurable synthetic tuning probe system of claim 1, wherein the carriage and vertical axis of the load pull tuner are remotely controlled using stepper motors and gear.

* * * * *